United States Patent [19]

Yoneda

[11] Patent Number: 5,855,682
[45] Date of Patent: Jan. 5, 1999

[54] PLASMA THIN-FILM FORMING APPARATUS

[75] Inventor: Katsumi Yoneda, Nagoya, Japan

[73] Assignee: Nippon Laser & Electronics Lab, Nagoya, Japan

[21] Appl. No.: 789,552

[22] Filed: Jan. 27, 1997

[30] Foreign Application Priority Data

Oct. 2, 1996 [JP] Japan .................................... 8-281794

[51] Int. Cl.[6] .............................. C23C 16/00; H05H 1/00
[52] U.S. Cl. .................. 118/723 VE; 118/723 E
[58] Field of Search ......................... 118/723 VE, 723 R, 118/723 E

[56] References Cited

U.S. PATENT DOCUMENTS

| | | | |
|---|---|---|---|
| 5,312,509 | 5/1994 | Eschbach | 118/723 ME |
| 5,670,218 | 9/1997 | Baek | 118/723 VE |

*Primary Examiner*—Thi Dang
*Attorney, Agent, or Firm*—Frishauf, Holtz, Goodman, Langer & Chick

[57] ABSTRACT

A plasma thin-film forming apparatus comprises a vacuum vessel, a positive and a negative electrode disposed in the vacuum vessel so that the discharge surfaces may face each other at a required interval, an exhaust means for making a required vacuum condition in the interior of the vacuum vessel, a high-voltage impressing means for generating DC glow discharge by impressing high voltage between the positive and the negative electrode, and a gas-inducting means for supplying metal compound-including gas into the vacuum vessel. The gas-inducting means comprises a flexible holding member gastightly fitted to a sublimation chamber communicating with the vacuum vessel and having a hollow portion therein and a glass container inserted in the hollow portion of the holding member and enclosing a predetermined quantity of crysterized osmium tetraoxide therein. The exhaust means is provided with a material gas-adsorbing means in the exhaust port.

2 Claims, 3 Drawing Sheets

PLASMA THIN-FILM FORMING APPARATUS

BACKGROUND OF THE INVENTION

1. Field of the Invention

The present invention relates to a plasma thin-film forming apparatus for forming osmium thin-film on the surface of a film-coating body provided in the negative glow-phase zone.

2. Description of the Prior Arts

The present applicant has proposed a plasma thin-film forming apparatus in Japan Patent Application 1993-121595. This apparatus comprises a gastight vessel, a positive and a negative electrode disposed in the gastight vessel so that the discharge surfaces may face each other, an exhaust means for making a high vacuum condition in the interior of the gastight vessel, a gas-inducting means for diffusing material gas made from gasified predetermined metallic compound into the gastight vessel set in a high vacuum condition, and a high-voltage impressing means for generating DC glow discharge between the positive and the negative electrode. This apparatus may form a metallic thin-film by sticking and accumulating the positive-ionized gas molecules on the surface of a substrate disposed in the negative glow phase zone.

In this plasma thin-film forming apparatus, the gas-inducting means leads the material gas, which contains a metallic compound to be made into a thin-film on the surface of a thin-film-coating body, into the vacuum vessel and makes the gas pressure substantially constant in the vacuum vessel. In order to make the gas pressure constant, it was required to make constant concentration of the supplied material gas. Consequently, it is inevitable to accurately measure the crystalized metallic compound to be inducted in response to the required gasious concentration during forming the thin-film. Thus, the apparatus has a problem that the operation costs much labor.

Also in the apparatus, osmium tetraoxide is used as a material gas to form transparent thin-film that is low of electric resistant and superior in light transmission. However, osmium tetraoxide is very poisonous against the human body so that the working efficiency of forming thin-film was inferior because of difficulty to manage the gas to insure the safety of the operator. Especially, during the operation of forming thin-film, the constant gas pressure is maintained by discharging the exhaust air while osmium gas is supplied into the vacuum vessel; and after the operation of forming thin-film, the osmium gas is released into the atmosphere to recover the atmospheric pressure in the vacuum vessel. However, this was in danger of impairing the safety of the operator because of air contamination.

The present invention has been originated to resolve the above-described faults in the prior arts, and the object of the invention is to provide a plasma thin-film forming apparatus that is capable of forming a high accurate thin-film by simply metering a fixed quantity of the osmium gas to be inducted into the vacuum vessel.

Also, another object of the invention is to provide a plasma thin-film forming apparatus that is capable of securing the safety of the operator during the operation of forming thin-film.

DETAILED DESCRIPTION OF A PREFERRED EMBODIMENT

Figure 1:
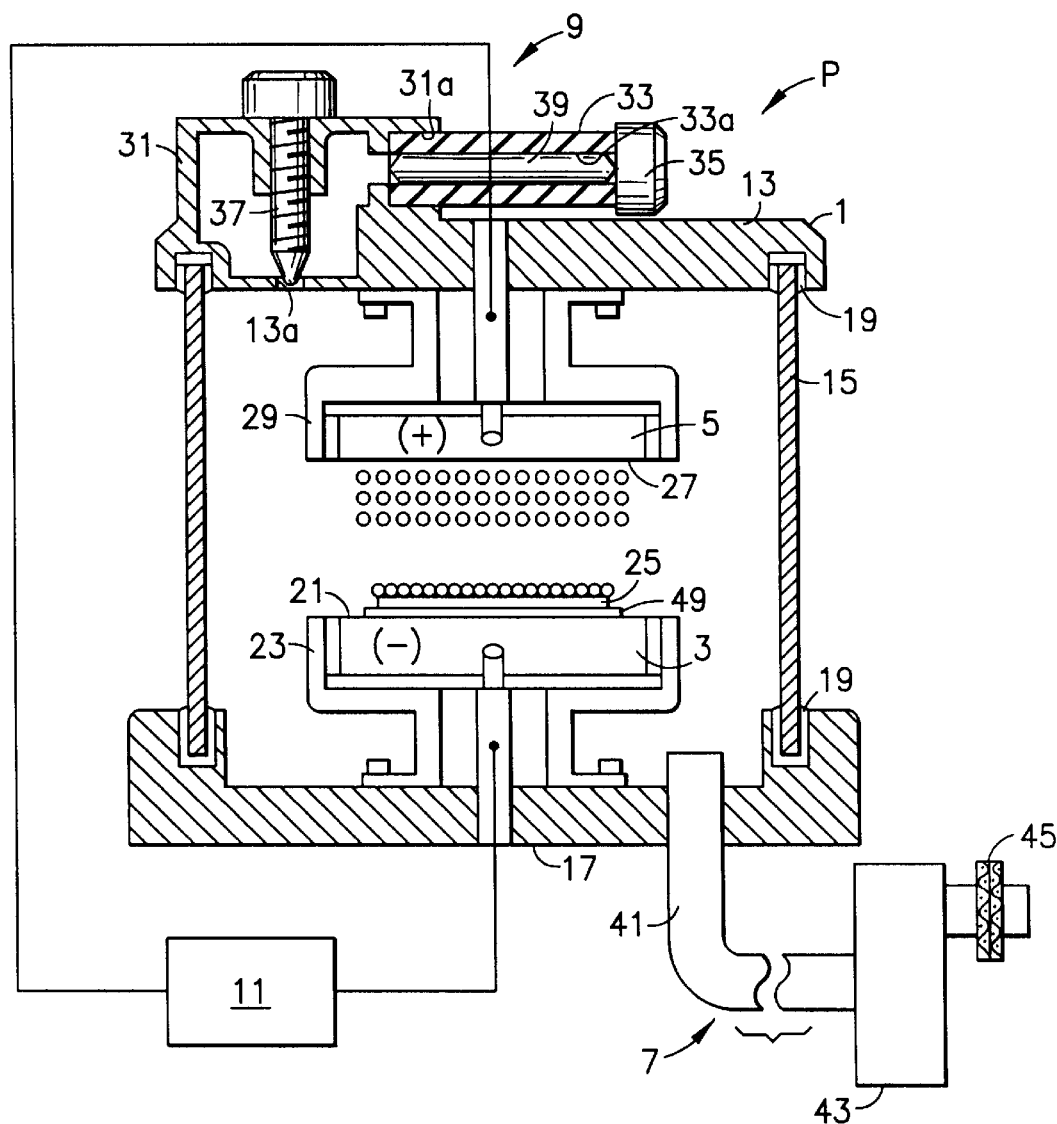
FIG. 1 is a schematic sectional view of a plasma thin-film forming apparatus embodying the invention.
Figure 2:
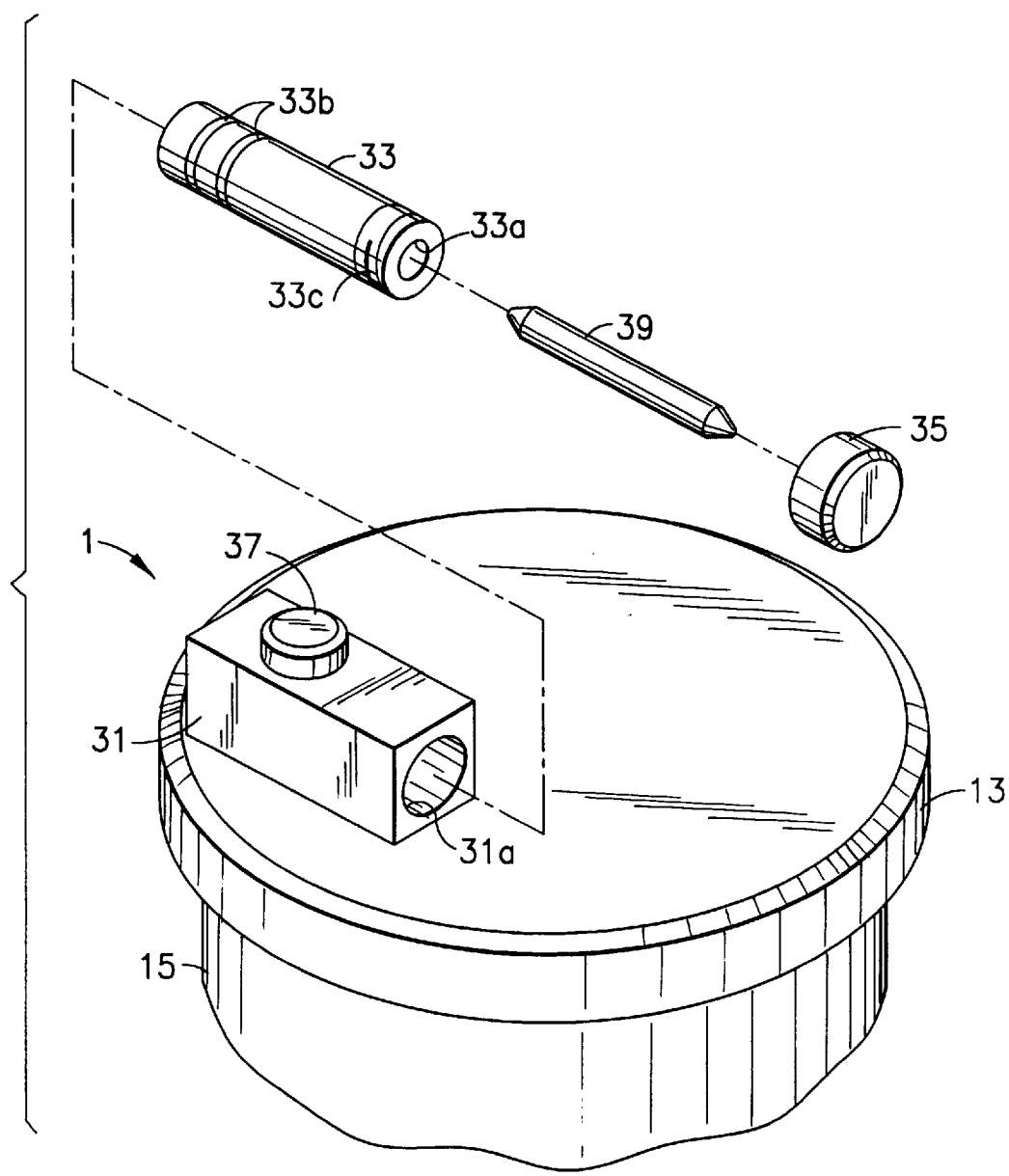
FIG. 2 is a schematic perspective view of a gas-inducting means.
Figure 3:
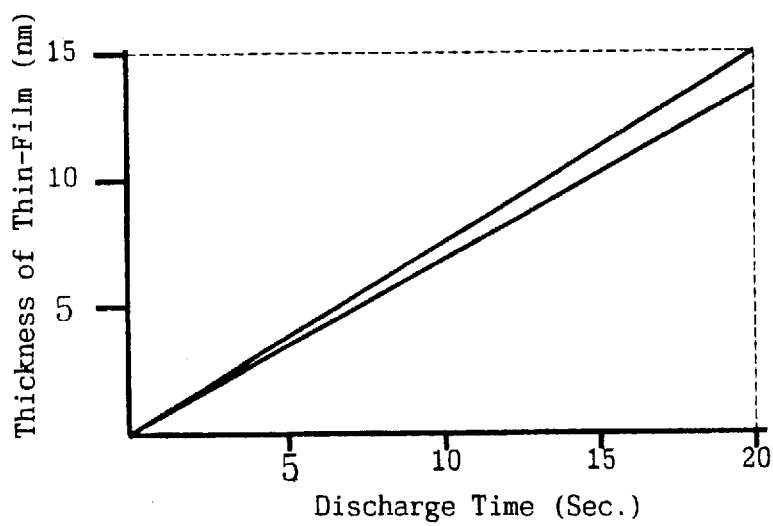
FIG. 3 is a graph of the relation between the discharge time and the thin-film thickness.

Referring now to FIG. 1 to FIG. 3, a preferred embodiment of the present invention will be described.

In FIG. 1 to FIG. 3, a plasma thin-film forming apparatus P comprises a vacuum vessel 1 that is capable of making a gastight condition in the interior, a negative electrode 3 and a positive electrode 5 disposed in the vacuum vessel 1, an exhaust means 7 to make a high vacuum condition in the interior of the vacuum vessel 1, a gas-inducting means 9 to induct the sublimated gas of osmium tetraoxide ($O_sO_4$) into the vacuum vessel 1, and a power source means 11 to impress DC high voltage between the negative electrode 3 and positive electrode 5.

The vacuum vessel 1 comprises, for example, a ceiling portion 13, a cylindrical portion 15 made of glass or stainless steel, a base plate 17 made of metal, packings 19, etc. Incidentally, in case of use in the field of biology and medicine, a cutter and hanger (neither is shown) corresponding to the freese-fracture etching method may be provided in the interior of the vacuum vessel 1.

The base plate 17 is provided with the negative electrode 3 with the discharge surface 21 facing upward and in the electrically insulated condition. Besides, around the negative electrode 3 except for the discharge surface 21 is provided an anti-leak-discharge cylinder 23 to prevent the leak discharge. In some kind of the thin-film coating body 25, it is required to heat the thin-film coating body 25 to a required temperature. In this case, the negative electrode 3 may be provided with an electric heater and thermocouple (neither is shown) in the space (not shown) formed in the interior of the electrode to heat the negative electrode by the electric heater and control the temperature by the thermocouple.

The ceiling portion 13 is provided with the positive electrode 5 with the discharge surface 27 facing downward and in the electrically insulated condition. Besides, around the positive electrode 5 except for the discharge surface 27 is provided an anti-leak-discharge cylinder 29 to prevent the leak discharge.

The gas-inducting means 9 is provided on the upper surface of the ceiling portion 13, comprising a sublimation chamber 31 communicating with the interior of the vacuum vessel 1, a holding member 33 gastightly inserted into a joint port portion 31a of the sublimation chamber 31, and a closing member 35 such as cap gastightly to close the holding member 33. In a through hole 13a communicating with the sublimation chamber 31 and vacuum vessel 1 is provided an adjust screw 37 for regulating the quantity of the osmium gas inducted into the vacuum vessel 1.

The holding member 33 is made of elastic material such as silicon rubber or the like in a cylindrical shape with a hollow portion 33a in the interior of it, and provided with packings 33b around the peripheral surface of the one end in the side of the joint port portion 31a. Also, the holding member 33 is provided with threads 33c formed around the peripheral surface of the other end, to which a closing member 35 is gastightly threaded. Incidentally, the packing 33b is allowable either to be what is integrally formed around the peripheral surface of the one end portion of the holding member 33 or to be what is fitted in a groove (not shown) formed around the surface of the end portion.

In the hollow portion 33a of the holding member 33 is inserted a glass container 39 enclosing a predetermined quantity, for example, 0.1 g of the crystal powder of osmium tetraoxide. This glass container 39 can be made easy to break by previously making a scratch on the peripheral surface when the container 39 is inserted into the hollow portion 33a of the holding member 33.

The exhaust means 7 comprises a rotary pump 43 connected to an exhaust pipe 41 fitted to the base plate 17 so as to communicate with the interior of the vacuum vessel 1 and a gas-adsorbing member 45 provided on the exhaust port of the rotary pump 43. This gas-adsorbing member 45 has a filter with the required mesh stuck with potassium permanganate and activated alumina, adsorbing osmium gas exhausted out of the vacuum vessel 1 and passing through the mesh so as to separate the osmium gas from the air. Also, the exhaust means 7 makes a vacuum condition of about $1 \times 10^{-3}$ Torr in the interior of the vacuum vessel 1 according to the driving of the rotary pump 43.

The power source means 11 has the (+) side connected to the positive electrode 5 and the (−) side connected to the negative electrode 3 respectively, impressing DC power valuably set in the range of about 1 to 3 kV. Besides, DC power impressed between the negative electrode 3 and positive electrode 5 is monitored by a voltmeter and ammeter (neither is shown).

Next, the operation of forming osmium thin-film in the plasma thin-film forming apparatus arranged as described above will be explained hereinafter.

First of all, a film-coating body such as a silicon substrate, glass plate, or in case of making a replica of thin-film, a sample is mounted through an insulating plate 49 on the upper surface of the negative electrode 3 above the open base plate 17 so that the body 25 may position in the negative glow phase. The insulating plate 49 is made of, for example, a ceramic plate which is superior in thermal conductivity and has electrical insulating property. Then, the ceiling portion 13 and cylindrical portion 15 are respectively installed on the base plate 17 to form the vacuum vessel 1.

Further, the one end of the holding member 33 is inserted into the joint port portion 31a of the sublimation chamber 31. Prior to this, the holding member 33 has the glass container 39, which encloses crysterized osmium tetraoxide, inserted in the hollow portion 33a and is closed at the other end with the closing member 35. At this time, the through hole 13a is made open by rotating the adjust screw 37 so that the sublimation chamber 31 may be communicated with the interior of the vacuum vessel 1.

Next, by driving the exhaust means 7 to exhaust the air from the interior of the vacuum vessel 1, the vacuum condition below about $1 \times 10^{-3}$ Torr is made in the interior of the vacuum vessel 1 and thereafter by rotating the adjust screw 37 the through hole 13a is closed. Then, in this condition, by elastically deforming and bending the holding member 33 to break the glass container 39 in the hollow portion 33a, the osmium tetraoxide is sublimated to be gasified in the sublimation chamber 31. Then, by rotating the adjust screw 37 to open the through hole 13a, the osmium gas in the sublimation chamber 31 is inducted into the interior of the vacuum vessel 1 to produce the required gas pressure (0.06 to 0.07 Torr). Besides, when the gas pressure reaches the required value in the vacuum vessel 1, the through hole 13a is closed by rotating the adjust screw 37.

Next, in the above-described condition, when the required DC voltage is impressed between the negative electrode 3 and positive electrode 5 through the power source means 11, the osmium molecules inducted into the interior of the vacuum vessel 1 are excited to be in plasma condition according to the electric field between the negative electrode 3 and positive electrode 5 to generate glow discharge between the negative electrode 3 and positive electrode 5. Thus, the positive-ionized osmium molecules are stuck to and accumulated on the surface of the film-coating body 25, so that it is possible to form the osmium thin-film in amorphous property and high purity. At this time, since the film-coating body is disposed in the negative glow phase above the negative electrode 3, the osmium molecules can be stuck and accumulated over the surface of the film-coating body 25 in a substantially uniform condition. Incidentally, the relation between the discharge time and the thickness of formed thin-film is shown in FIG. 3 in the case that the osmium tetraoxide (0.1 g) enclosed in the glass container 39 is used at gas pressure 0.06 to 0.07 Torr, impressed voltage 1.1 to 1.2 kV, and impressed current 2 to 3 mA.

When the above-described operation is completed, the impression of DC current by the power source means 11 is interrupted. Then, as the exhaust means 7 is operated, the through hole 13a is made open by rotating the adjust screw 37 to induct the osmium gas remained in the sublimation chamber 31 into the interior of the vacuum vessel 1, and at the same time, while the air is inducted into the interior of the vacuum vessel 1 by opening the air release valve (not shown) provided in the ceiling portion 13, the air and osmium gas in the interior of the vacuum vessel 1 are exhausted. At this time, since the exhaust osmium gas is adsorbed by the gas-adsorbing means 45 and separated from the air, it is possible to prevent the air contamination due to the osmium gas.

According to this embodiment of the invention, it is possible to form the high accurate thin-film while the osmium gas which is poisonous against the human body is supplied at the constant quantity securing the safety so as to stabilize the gasious concentration. Also, during the operation of forming thin-film and even after the operation, it is possible to secure the safety for the operational environment and prevent the air pollution by surely collecting the osmium gas in the interior of the vacuum vessel 1.

EXAMPLE 1

In the above-described plasma thin-film forming apparatus, the osmium thin-film was formed on the surface of glass substrates, and thereby substrates for photodevice such as solar cell, liquid crystal display, EL element were produced.

In the prior art of the transparent conductive thin-film for electrodes formed on the substrates for photodevices, it is known that there are thin-films made of such materials as Indium Tin Oxide (ITO), tin dioxide ($SnO_2$), and sinc oxide (ZnO). With respect to ITO thin-film among them, it is a crystal film which has the rugged surface, light transmittance 80% or more at wave length 400 to 1000 nm, and electrical resistivity $10^{-3}$ Ωcm. In case that ITO thin-film is used as the substrate for photodevice, especially the substrate for liquid crystal display, the high light transmittance is required even at wave length 400 nm or below and the electrical resistivity $2 \times 10^{-4}$ Ωcm is required. Consequently, there is a problem that the operation of forming ITO thin-film requires a high level technique such as keeping a high level of donor density.

On the contrary, the osmium thin-film formed in accordance with the embodiment of the invention is amorphous, having little ruggedness on the surface, light transmittance 80% or more in the visible radiation zone, and electrical resistivity about $10^{-6}$ Ωcm. Consequently, the present thin-film is very effective to form the electrode on the substrate for photodevice.

EXAMPLE 2

On a silicon or a glass substrate the required pattern of an electrode is previously formed with photoresist, and on the silicon or the glass substrate an osmium thin-film is formed, so that the pattern of an electrode is formed with photoresist. After the forming of thin-film, the photoresist and the excessive osmium thin-film were removed from the silicon or the glass substrate, and thus the pattern of the electrode was formed on the silicon or the glass substrate.

Incidentally, after the osmium thin-film was formed on the silicon or the glass substrate, the pattern of the electrode was formed according to the photoresist pattern. Next, this substrate was treated by etching with $O_2$ plasma, so that it was possible to easily etch the osmium thin-film formed on the places without the photoresist.

The electrode of the osmium thin-film formed as described above has high purity and low electrical resistance and further can be formed in micro pattern, so that it is possible to make a transparent electrode with higher density.

EXAMPLE 3

An osmium thin-film was formed on the surface of a sample for an electron microscope. The formed osmium thin-film was superior in electric conductivity, good in radiation of second electron, and could be under the radiation of a high power electron beam without electrification or occurrence of contamination, so that it was possible to be used for microscopic in high resolving power. Incidentally, for the microscopic sample, it is suitable to make a replica of osmium thin-film by forming an osmium thin-film of thickness 10 to 20 nm on the surface of the sample and thereafter by immersing it in a solution that can dissolve the sample only.

What is claimed is:

1. A plasma thin-film forming apparatus comprising:

a vacuum vessel;

a positive and a negative electrode disposed in said vacuum vessel so that the discharge surfaces may face each other at a required interval;

an exhaust means for making a required vacuum condition in the interior of said vacuum vessel;

a high-voltage impressing means for generating DC glow discharge by impressing high voltage between said positive and said negative electrode;

a gas-inducting means for supplying metal compound-including gas into said vacuum vessel;

said gas-inducting means comprising a flexible holding member gastightly fitted to a sublimation chamber communicating with said vacuum vessel and having a hollow portion therein and a glass container inserted in the hollow portion of said holding member and enclosing a predetermined quantity of crystallized osmium tetraoxide therein;

said gas-inducting means which is capable of inducting osmium gas into said vacuum vessel by elastically deforming said holding member to break said glass container in the required vacuum condition of said vacuum vessel set by said exhaust means after fitting said holding member with said glass container inserted in the hollow portion to said sublimation chamber; and said exhaust means provided with a material gas-adsorbing means in the exhaust port for adsorbing and collecting the osmium gas contained in the exhausted air out of said vacuum vessel.

2. A plasma thin-film forming apparatus as defined in claim 1 wherein said material gas-adsorbing means has a filter with the predetermined mesh size stuck with particles of potassium permanganate and activated alumina.

* * * * *